US012757584B2

(12) United States Patent
Kim et al.

(10) Patent No.: US 12,757,584 B2
(45) Date of Patent: Oct. 6, 2026

(54) DISPLAY MODULE

(71) Applicant: Samsung Display Co., Ltd., Yongin-si (KR)

(72) Inventors: Gee-Bum Kim, Yongin-si (KR); Kwang Soo Bae, Yongin-si (KR); Bokwang Song, Yongin-si (KR); Min Oh Choi, Yongin-si (KR); Soo Yeong Hong, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 346 days.

(21) Appl. No.: 18/630,951

(22) Filed: Apr. 9, 2024

(65) Prior Publication Data

US 2024/0365601 A1 Oct. 31, 2024

(30) Foreign Application Priority Data

Apr. 27, 2023 (KR) ........................ 10-2023-0055116

(51) Int. Cl.
*H10K 59/122* (2023.01)
*H10K 39/34* (2023.01)
*H10K 59/35* (2023.01)

(52) U.S. Cl.
CPC ........... *H10K 59/122* (2023.02); *H10K 39/34* (2023.02); *H10K 59/353* (2023.02)

(58) Field of Classification Search
CPC .... H10K 59/122; H10K 39/34; H10K 59/353; H10K 59/40; H10K 59/60; H10K 59/65; H10K 30/82; H10K 30/85; H10K 30/86; H10K 50/15; H10K 50/16; H10K 59/35; H10K 59/38; H10K 59/805; H10K 59/873; H10K 59/8792
See application file for complete search history.

(56) References Cited

U.S. PATENT DOCUMENTS

| | | | | |
|---|---|---|---|---|
| 9,666,817 | B2 * | 5/2017 | Kim | H10K 30/82 |
| 9,960,353 | B2 * | 5/2018 | Liang | H10K 71/30 |
| 10,504,974 | B2 * | 12/2019 | Gao | H10K 59/1213 |
| 11,422,661 | B2 | 8/2022 | Yeke Yazdandoost et al. | |

(Continued)

FOREIGN PATENT DOCUMENTS

| | | |
|---|---|---|
| KR | 10-2021-0109566 A | 9/2021 |
| KR | 10-2021-0126649 A | 10/2021 |

*Primary Examiner* — Tuyen K Vo
(74) *Attorney, Agent, or Firm* — Womble Bond Dickinson (US) LLP

(57) ABSTRACT

A display module includes: a base layer; a pixel definition layer on the base layer, and having a first opening and a second opening; and an element layer including: a light emitting element corresponding to the first opening, and including: a first light emitting electrode on the base layer; a light emitting layer on the first light emitting electrode; and a second light emitting electrode on the light emitting layer; and a light receiving element corresponding to the second opening, and including: a first light receiving electrode on the base layer; a light receiving layer on the first light receiving electrode; a second light receiving electrode on the light receiving layer; and an optical compensation layer between the first light receiving electrode and the light receiving layer, and not overlapping with the first light emitting electrode in a plan view, the optical compensation layer including a transparent conductive oxide.

20 Claims, 8 Drawing Sheets

(56) References Cited

U.S. PATENT DOCUMENTS

| | | | | |
|---|---|---|---|---|
| 12,225,779 | B2 * | 2/2025 | Wang | H10K 59/123 |
| 2010/0012189 | A1 * | 1/2010 | Sakai | B82Y 10/00<br>136/261 |
| 2020/0212138 | A1 * | 7/2020 | Lee | G06V 40/1318 |
| 2020/0312930 | A1 * | 10/2020 | Choi | H10K 59/122 |
| 2021/0335939 | A1 * | 10/2021 | Li | H10K 59/878 |
| 2022/0069025 | A1 | 3/2022 | Yamazaki et al. | |
| 2022/0173174 | A1 | 6/2022 | Hatsumi et al. | |
| 2024/0276773 | A1 * | 8/2024 | Dai | H10K 59/1201 |

* cited by examiner

DISPLAY MODULE

CROSS-REFERENCED TO RELATED APPLICATION

The present application claims priority to and the benefit of Korean Patent Application No. 10-2023-0055116, filed on Apr. 27, 2023, in the Korean Intellectual Property Office, the entire content of which is incorporated by reference herein.

BACKGROUND

1. Field

Aspects of embodiments of the present disclosure relate to a display including a light receiving element that absorbs light to detect a fingerprint.

2. Description of Related Art

Various electronic devices are being used to provide image information. The electronic devices provide various functions to organically communicate with a user, such as sensing a user's input. Recent electronic devices may have a function to detect a fingerprint of the user.

Fingerprint recognition methods include a capacitive method that senses a variation in a capacitance formed between electrodes, an optical method that senses incident light using an optical sensor, and an ultrasonic method that senses a vibration using a piezoelectric material.

The above information disclosed in this Background section is for enhancement of understanding of the background of the present disclosure, and therefore, it may contain information that does not constitute prior art.

SUMMARY

One or more embodiments of the present disclosure are directed to a display that simplifies a manufacturing process of a mask, and prevents or substantially prevents a lateral leakage current without affecting the optical characteristics of a light emitting element.

According to one or more embodiments of the present disclosure, a display module includes: a base layer; a pixel definition layer on the base layer, and having a first opening and a second opening; and an element layer including: a light emitting element corresponding to the first opening, and including: a first light emitting electrode on the base layer; a light emitting layer on the first light emitting electrode; and a second light emitting electrode on the light emitting layer; and a light receiving element corresponding to the second opening, and distinguished from the light emitting element by the pixel definition layer. The light receiving element includes: a first light receiving electrode on the base layer; a light receiving layer on the first light receiving electrode; a second light receiving electrode on the light receiving layer; and an optical compensation layer between the first light receiving electrode and the light receiving layer, and not overlapping with the first light emitting electrode in a plan view. The optical compensation layer includes a transparent conductive oxide.

In an embodiment, the optical compensation layer may have a thickness equal to or greater than about 250 angstroms and equal to or smaller than about 330 angstroms.

In an embodiment, the optical compensation layer may have an optical transmittance equal to or greater than about 80%, and an electrical conductivity equal to or smaller than about $10^{-3}$ Ω*cm.

In an embodiment, the optical compensation layer may include at least one of indium tin oxide (ITO), indium zinc oxide (IZO), indium gallium zinc oxide (IGZO), tin oxide (TO), zinc oxide (ZO), gallium-doped zinc oxide (GZO), or aluminum-doped zinc oxide (AZO).

In an embodiment, the light emitting element may further include: a first hole transport region between the first light emitting electrode and the light emitting layer; and a first electron transport region between the light emitting layer and the second light emitting electrode. The light receiving element may further include: a second hole transport region between the optical compensation layer and the light receiving layer; and a second electron transport region between the light receiving layer and the second light receiving electrode. The first hole transport region may be integral with the second hole transport region, and the first electron transport region may be integral with the second electron transport region.

In an embodiment, the element layer may further include a capping layer on the second light emitting electrode and the second light receiving electrode.

In an embodiment, the display module may further include: an encapsulation layer on the element layer to cover the light emitting element and the light receiving element; and an input sensing layer on the encapsulation layer. The encapsulation layer may include at least one organic layer and at least one inorganic layer, and the input sensing layer may include an input sensing electrode located to not overlap with the light emitting element and the light receiving element in a plan view.

In an embodiment, the light emitting element may not overlap with the light receiving element in a plan view.

In an embodiment, the light emitting layer may be configured to emit a first light to travel from the light emitting layer to the second light emitting electrode, and the light receiving layer may be configured to absorb a second light traveling from the second light receiving electrode to the light receiving layer.

In an embodiment, the second light may have a wavelength equal to or greater than about 495 nm and equal to or smaller than about 570 nm.

In an embodiment, the light receiving element may have an external quantum efficiency of about 50% or more and about 62% or less with respect to the second light.

According to one or more embodiments of the present disclosure, a display module includes: first, second, and third light emitting areas; a non-light-emitting area; a light receiving area; a base layer; a first electrode on the base layer, and including: a first-first light emitting electrode corresponding to the first light emitting area; a first-second light emitting electrode corresponding to the second light emitting area; a first-third light emitting electrode corresponding to the third light emitting area; and a first light receiving electrode corresponding to the light receiving area; an optical compensation layer directly on the first light receiving electrode, and not overlapping with the first-first, first-second, and first-third light emitting electrodes; a hole transport region including: a first hole transport region on the first-first light emitting electrode, the first-second light emitting electrode, and the first-third light emitting electrode; and a second hole transport region on the optical compensation layer; a first light emitting layer on the first hole transport region to correspond to the first light emitting area, and configured to emit first-first light to travel from the first-first light emitting electrode to the first hole transport region; a second light emitting layer on the first hole transport region to correspond to the second light emitting area, and configured to emit first-second light to travel from the first-second light emitting electrode to the first hole transport region; a third light emitting layer on the first hole transport region to correspond to the third light emitting area, and configured to emit first-third light to travel from the first-third light emitting electrode to the first hole transport region; a light receiving layer on the second hole transport region, and configured to absorb second light traveling from the second hole transport region to the optical compensation layer; an electron transport region on the first, second, and third light emitting layers and the light receiving layer; and a second electrode on the electron transport region.

In an embodiment, the optical compensation layer may have a thickness equal to or greater than about 250 angstroms and equal to or smaller than about 330 angstroms.

In an embodiment, the optical compensation layer may have an optical transmittance equal to or greater than about 80%, and an electrical conductivity equal to or smaller than about $10^{-3}$ Ω*cm.

In an embodiment, the optical compensation layer may include at least one of indium tin oxide (ITO), indium zinc oxide (IZO), indium gallium zinc oxide (IGZO), tin oxide (TO), zinc oxide (ZO), gallium-doped zinc oxide (GZO), or aluminum-doped zinc oxide (AZO).

In an embodiment, the light receiving layer may have an external quantum efficiency of about 50% or more and about 62% or less with respect to the second light.

In an embodiment, the display module may further include: a capping layer on the second electrode; an encapsulation layer on the capping layer, and including at least one organic layer and at least one inorganic layer; an input sensing layer on the encapsulation layer, and including an input sensing electrode corresponding to the non-light-emitting area; and a color filter layer on the input sensing layer.

In an embodiment, the color filter layer may include: a first-first color filter layer corresponding to the first light emitting area; a first-second color filter layer corresponding to the second light emitting area; a first-third color filter layer corresponding to the third light emitting area; and a second color filter layer corresponding to the light receiving area.

In an embodiment, the first-first color filter layer may be configured to transmit light having a wavelength equal to or greater than about 620 nm and equal to or smaller than about 750 nm; the first-second color filter layer may be configured to transmit light having a wavelength equal to or greater than about 495 nm and equal to or smaller than about 570 nm; the first-third color filter layer may be configured to transmit light having a wavelength equal to or greater than about 450 nm and equal to or smaller than about 495 nm; and the second color filter layer may be configured to transmit light having a wavelength equal to or greater than about 450 nm and equal to or smaller than about 2500 nm.

In an embodiment, the display module may further include a light blocking portion corresponding to the non-light-emitting area.

According to one or more embodiments of the present disclosure, as the hole transport region of the light emitting element and the hole transport region of the light receiving element may not be formed concurrently (e.g., simultaneously or substantially simultaneously) with each other, a process of forming a mask for the display may be simplified when compared with a process of forming a comparative mask. In addition, because the hole transport region may not be commonly formed in the light emitting element and the light receiving element, a compensation layer for compensation of an optical distance may be formed separately, thereby preventing or substantially preventing a lateral leakage current from occurring. Accordingly, efficiency of an electronic device may be improved.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
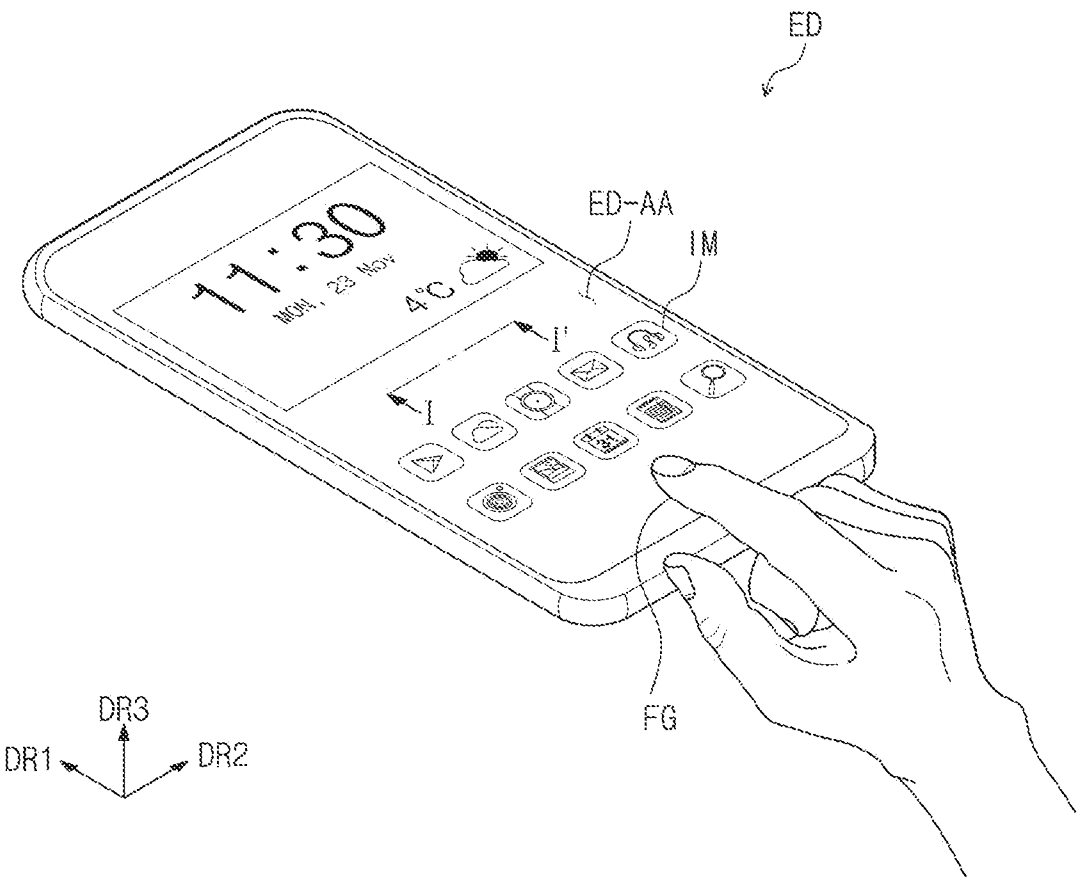
FIG. 1 is a perspective view of an electronic device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
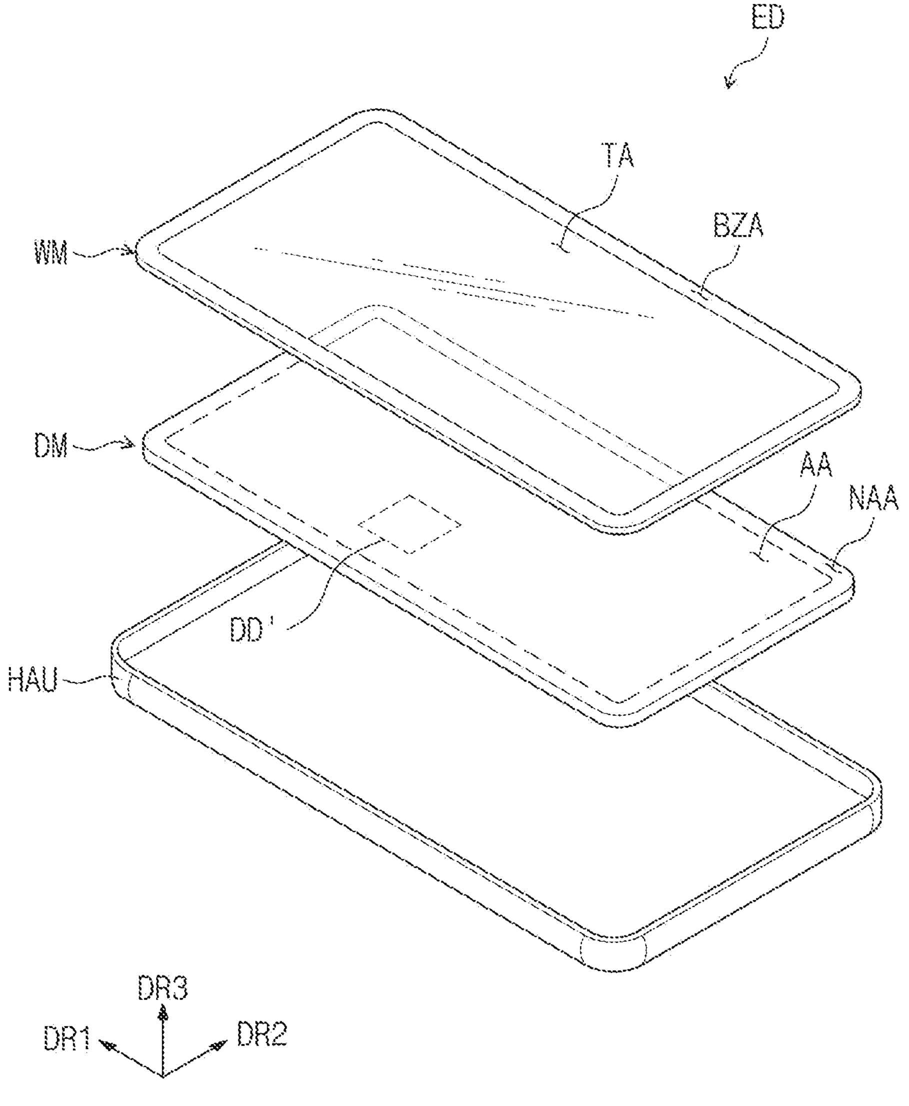
FIG. 2 is an exploded perspective view of an electronic device according to an embodiment of the present disclosure.
Figure 3:
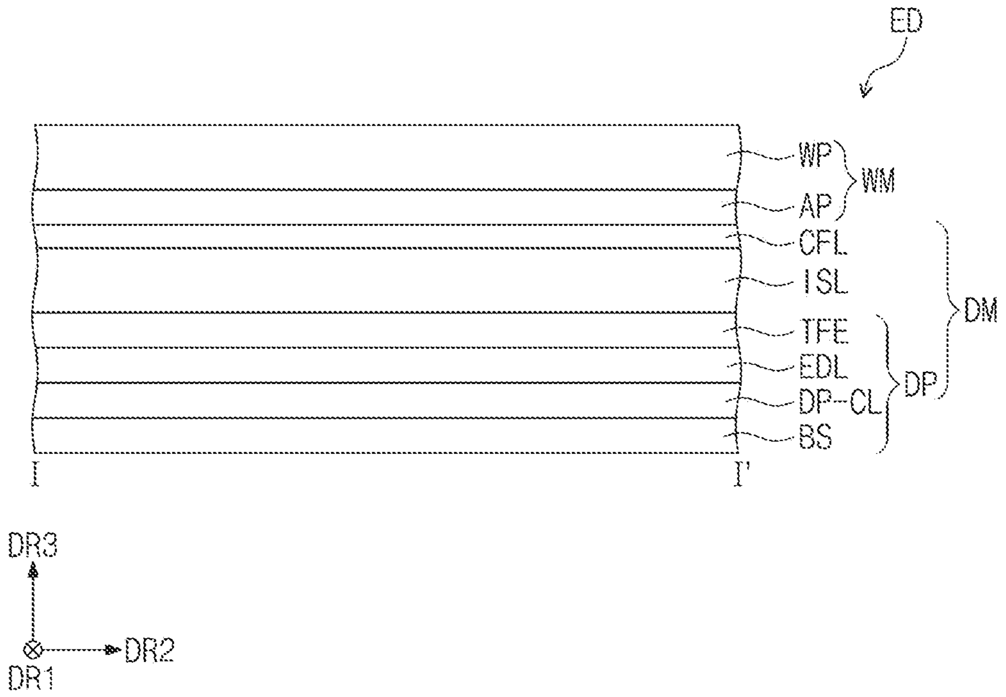
FIG. 3 is a cross-sectional view taken along the line I-I' of FIG. 1.

FIG. 1 is a perspective view of an electronic device ED according to an embodiment of the present disclosure. FIG. 2 is an exploded perspective view of the electronic device ED according to an embodiment of the present disclosure. FIG. 3 is a cross-sectional view taken along the line I-I' of FIG. 1.

The electronic device ED shown in FIGS. 1 to 3 may be a device activated in response to electrical signals. For example, the electronic device ED may be a mobile phone, a tablet computer, a car navigation unit (e.g., a car navigation device), a game unit (e.g., a game console), or a wearable device. However, the present disclosure is not limited thereto or thereby. FIG. 1 shows the mobile phone as a representative example of the electronic device ED.

The electronic device ED may display an image IM through an active area ED-AA. The active area ED-AA may include a plane defined by a first directional axis DR1 and a second directional axis DR2. The active area ED-AA may further include a curved surface that is bent from at least one side of the plane defined by the first directional axis DR1 and the second directional axis DR2. For example, the active area ED-AA may include only the plane, or the active area ED-AA may include the plane and two or more curved surfaces (e.g., four curved surfaces respectively bent from four sides of the plane).

The first, second, third, and fourth directional axes DR1, DR2, DR3, and DR4 shown in the figures, and the directions indicated by the first, second, third, and fourth directional axes DR1, DR2, DR3, and DR4 may be relative to each other, and thus, may be variously modified to other suitable directions. In addition, the directions indicated by the first, second, third, and fourth directional axes DR1, DR2, DR3, and DR4 may be referred to as first, second, third, and fourth directions, respectively, and may be assigned with the same reference numerals as those of the first, second, third, and fourth directional axes DR1, DR2, DR3, and DR4.

In the following, the first directional axis DR1 may be perpendicular to or substantially perpendicular to the second directional axis DR2. The third directional axis DR3 may be a normal line direction of the plane defined by the first directional axis DR1 and the second directional axis DR2. The fourth directional axis DR4 may be a direction between the first directional axis DR1 and the second directional axis DR2.

A thickness direction of the electronic device ED may be parallel to or substantially parallel to the third directional axis DR3, which is the normal line direction of the plane defined by the first directional axis DR1 and the second directional axis DR2. Front (e.g. upper) and rear (e.g., lower) surfaces of each member of the electronic device ED may be defined with respect to the third directional axis DR3.

According to an embodiment, the image IM provided from the electronic device ED may include a still image as well as a video. FIG. 1 shows a clock widget and application icons as a representative example of the image IM. A surface through which the image IM is displayed may correspond to the front surface of the electronic device ED and the front surface of a window member WM.

According to an embodiment, the electronic device ED may sense a user input applied thereto from the outside. The user input may include various suitable kinds of external inputs, such as a part of a user's body, light, heat, and/or pressure. According to an embodiment, the electronic device ED may sense the user input through the active area ED-AA, and may respond to the sensed input. In addition, the electronic device ED may sense the user input applied to a side surface or a rear surface of the electronic device ED depending on design requirements. However, the present disclosure is not limited to a specific embodiment.

As an example, the electronic device ED may sense biometric information applied thereto from the outside, such as a user's fingerprint FG. The electronic device ED may include a fingerprint recognition area defined in the active area ED-AA. The fingerprint recognition area may be defined in the entirety (e.g., the entire portion) of the active area ED-AA, or may be defined in a portion (e.g., a partial part) of the active area ED-AA.

Referring to FIGS. 1, 2 and 3, the electronic device ED may include a display module (e.g., a display or a display device) DM, the window member WM, and a housing HAU. According to an embodiment, the window member WM and the housing HAU may be coupled with each other to form an appearance (e.g., an outer appearance) of the electronic device ED.

According to an embodiment, the display module DM may include an active area AA and a peripheral area NAA defined therein. The active area AA may be activated in response to electrical signals, and may correspond to the active area ED-AA of the electronic device ED. As described above, the active area AA may be an area in which the image IM is displayed, or the external input is sensed.

The peripheral area NAA may be defined adjacent to at least one side of the active area AA. The peripheral area NAA may be defined to surround (e.g., around a periphery of) the active area AA. However, the present disclosure is not limited thereto or thereby. Unlike that shown in FIG. 2, according to an embodiment, a portion of the peripheral area NAA may be omitted as needed or desired. A driving circuit or a driving line may be arranged in the peripheral area NAA to drive the active area AA.

According to an embodiment, the display module DM may include a display panel DP, and an input sensing layer ISL disposed on the display panel DP. In some embodiments, the display module DM may further include an organic planarization layer disposed on the input sensing layer ISL.

The display module DM may include a base layer BS, and an element layer EDL disposed on the base layer BS. In addition, the display panel DP may include a circuit layer DP-CL disposed on the base layer BS between the base layer BS and the element layer EDL, and an encapsulation layer TFE disposed on the element layer EDL. The encapsulation layer TFE may cover the element layer EDL.

The electronic device ED may further include the window member WM disposed on the display module DM. The window member WM may include a window WP and an adhesive layer AP. The adhesive layer AP may be disposed between a color filter layer CFL and the window WP. The adhesive layer AP may be an optically clear adhesive (OCA) film or an optically clear adhesive resin (OCR) layer. According to an embodiment, the adhesive layer AP may be omitted as needed or desired.

The window WP may cover an entire outer side of the display module DM. The window WP may have a shape corresponding to a shape of the display module DM. According to an embodiment, the window WP of the electronic device ED may include an optically transparent insulating material. The window WP may be a glass substrate or a polymer substrate. As an example, the window WP may be a tempered glass substrate. The window WP may be an uppermost layer of the electronic device ED.

In addition, according to an embodiment, the window member WM of the electronic device ED may include a transmissive area TA and a bezel area BZA, which are defined therein. The transmissive area TA may correspond to the active area AA of the display module DM, and the bezel area BZA may correspond to the peripheral area NAA of the display module DM.

The front surface of the window member WM, which includes the transmissive area TA and the bezel area BZA, may correspond to the front surface of the electronic device ED. The user may view the image IM provided through the transmissive area TA corresponding to the front surface of the electronic device ED.

The bezel area BZA may define a shape of the transmissive area TA. The bezel area BZA may be adjacent to the transmissive area TA, and may surround (e.g., around a periphery of) the transmissive area TA. However, the present disclosure is not limited thereto or thereby. According to an embodiment, the bezel area BZA may be disposed to be adjacent to only one side of the transmissive area TA, or may be partially omitted as needed or desired.

According to an embodiment, a portion of the electronic device ED, which may be recognized through the bezel area BZA of the electronic device ED, may have a relatively lower light transmittance compared with that of a portion of the electronic device ED, which may be recognized through the transmissive area TA of the electronic device ED. In addition, the bezel area BZA of the electronic device ED may have a suitable color (e.g., a predetermined color).

According to an embodiment, the electronic device ED may include the color filter layer CFL. As an example, the color filter layer CFL may transmit light having a desired wavelength range (e.g., a specific or predetermined wavelength range).

The input sensing layer ISL included in the electronic device ED may overlap with a light emitting element DE (e.g., refer to FIG. 5A) and a light receiving element ISD, and may be disposed on the display panel DP. The input sensing layer ISL may sense an external input applied thereto from the outside. The external input may be the user input. The user input may include various suitable kinds of external inputs, such as a part of the user's body, light, heat, pen, and/or pressure.

Figure 4:
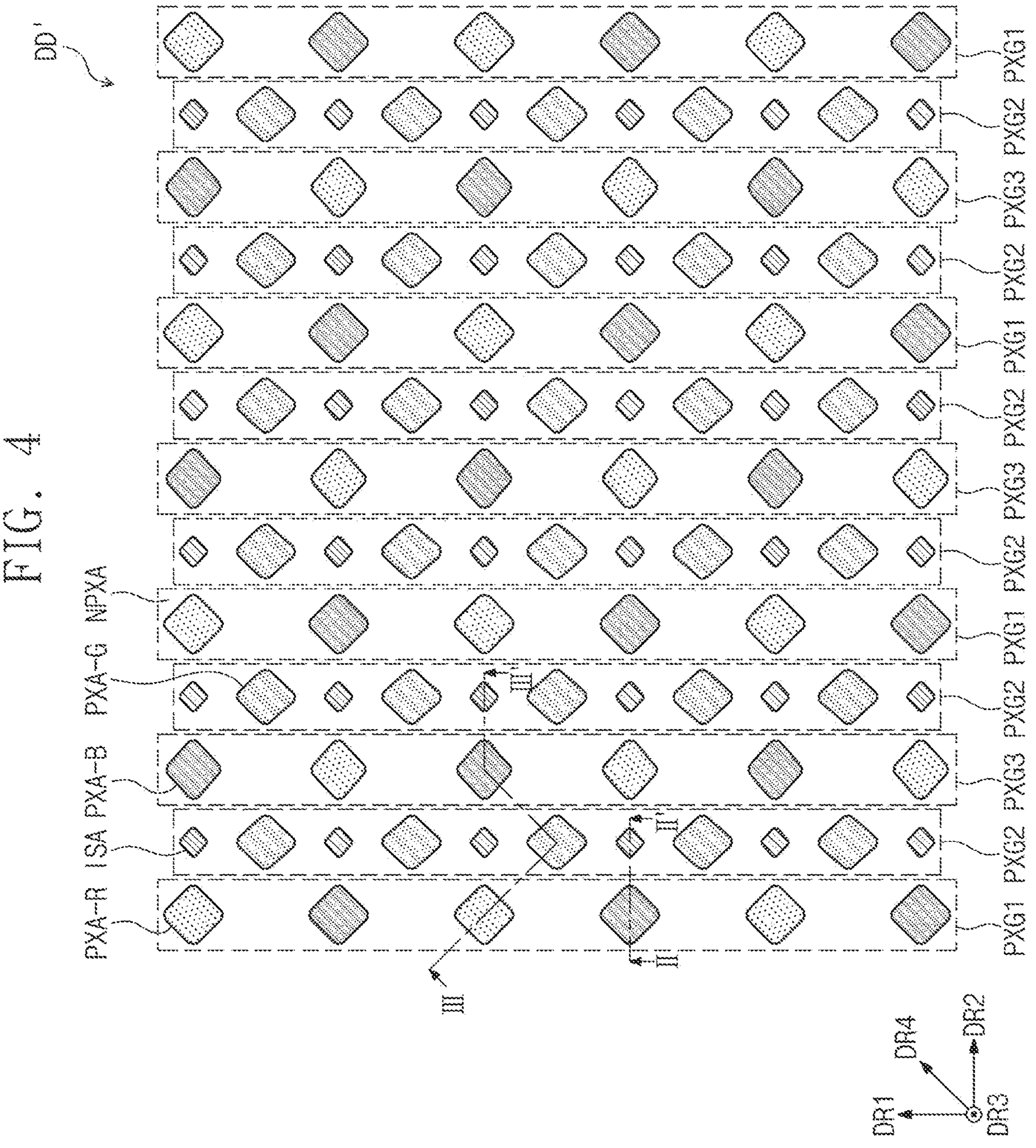
FIG. 4 is a plan view of a display module in the area DD' of FIG. 2 according to an embodiment of the present disclosure.

FIG. 4 is a plan view of the display module DM in the area DD' of FIG. 2 according to an embodiment of the present disclosure. For example, FIG. 4 may be a plan view of the display panel DP of the display module DM in the area DD' of FIG. 2.

According to an embodiment, the display module DM may include a plurality of light emitting areas PXA-R, PXA-G, and PXA-B and a light receiving area ISA, which are arranged in the active area AA. The display module DM may include a first light emitting area PXA-R for emitting red light, a second light emitting area PXA-G for emitting green light, and a third light emitting area PXA-B for emitting blue light. In addition, the display module DM may include the light receiving area ISA that receives and senses light incident thereto after being reflected by an external object. A non-light-emitting area NPXA may be defined between the light emitting areas PXA-R, PXA-G, and PXA-B, and between the light emitting areas PXA-R, PXA-G, and PXA-B and the light receiving area ISA. The light emitting areas PXA-R, PXA-G, and PXA-B may be distinguished from each other by the non-light-emitting area NPXA, and the light emitting areas PXA-R, PXA-G, and PXA-B may be distinguished from the light receiving area ISA by the non-light-emitting area NPXA. The non-light-emitting area NPXA may surround (e.g., around a periphery of) each of the light emitting areas PXA-R, PXA-G, and PXA-B and the light receiving area ISA.

According to an embodiment, the light emitting areas for emitting light in different wavelength ranges from each other from among the light emitting areas PXA-R, PXA-G, and PXA-B may have different sizes from each other. In this case, the size may refer to the size when viewed in the plane defined by the first directional axis DR1 and the second directional axis DR2 (e.g., in a plan view).

However, the present disclosure is not limited thereto or thereby. According to an embodiment, the light emitting areas PXA-R, PXA-G, and PXA-B may have the same or substantially the same size as each other. In other embodiments, the light emitting areas PXA-R, PXA-G, and PXA-B may emit light having different colors from the red light, the green light, and the blue light, and may have planar shapes different from those shown in FIG. 4.

According to an embodiment, the light receiving area ISA may have a size smaller than the size of each of the first light emitting area PXA-R, the second light emitting area PXA-G, and the third light emitting area PXA-B when viewed in the plane (e.g., in a plan view). However, the present disclosure is not limited thereto or thereby. According to an embodiment, the size of the light receiving area ISA may be equal to or greater than that of at least one of the first light emitting area PXA-R, the second light emitting area PXA-G, and/or the third light emitting area PXA-B.

Referring to FIG. 4, the first light emitting areas PXA-R may be alternately arranged with the third light emitting areas PXA-B along the first directional axis DR1 to form a first group PXG1. The second light emitting areas PXA-G may be alternately arranged with the light receiving areas ISA along the first directional axis DR1 to form a second group PXG2. In addition, the third light emitting areas PXA-B may be alternately arranged with the first light emitting areas PXA-B along the first directional axis DR1 to form a third group PXG3.

The first group PXG1 to the third group PXG3 may be sequentially arranged along the second directional axis DR2. Each of the first group PXG1, the second group PXG2, and the third group PXG3 may be provided in a plurality. In the embodiment shown in FIG. 4, the first group PXG1, the second group PXG2, the third group PXG3, and the second group PXG2 arranged along the second directional axis DR2 may form one repeating unit, and the repeating unit may be repeatedly arranged along the second directional axis DR2.

According to an embodiment, one second light emitting area PXA-G may be disposed to be spaced apart from one first light emitting area PXA-R or one third light emitting area PXA-B in the fourth directional axis DR4. The fourth directional axis DR4 may be a direction between the first directional axis DR1 and the second directional axis DR2.

In addition, according to an embodiment, the light receiving area ISA may be spaced apart from each of the light emitting areas PXA-R, PXA-G, and PXA-B, and may be disposed between the first light emitting area PXA-R and the third light emitting area PXA-B to be spaced apart from the first light emitting area PXA-R and the third light emitting area PXA-B in the second directional axis DR2. The light receiving area ISA may be alternately arranged with the second light emitting area PXA-G along the first directional axis DR1.

The arrangement structure of the light emitting areas PXA-R, PXA-G, and PXA-B shown in FIG. 4 may be referred to as an RGBG structure (e.g., a PENTILE® structure, PENTILE® being a duly registered trademark of Samsung Display Co., Ltd.). However, the arrangement structure of the light emitting areas PXA-R, PXA-G, and PXA-B in the electronic device is not limited to the arrangement structure shown in FIG. 4. As an example, according to an embodiment, the light emitting areas PXA-R, PXA-G, and PXA-B may have a stripe structure in which the first light emitting area PXA-R, the second light emitting area PXA-G, and the third light emitting area PXA-B are sequentially and alternately arranged with each other along the first directional axis DR1 or the second directional axis DR2. In addition, in the stripe structure, the light receiving area ISA may be arranged in the same row or in the same column as that of the second light emitting area PXA-G to form one stripe arrangement. However, according to an embodiment, an arrangement shape of the light receiving area ISA and the light emitting areas PXA-R, PXA-G, and PXA-B, and an arrangement ratio of the light receiving area ISA and the light emitting areas PXA-R, PXA-G, and PXA-B, may be different from the above described arrangement shape and arrangement ratio.

Figure 5A:
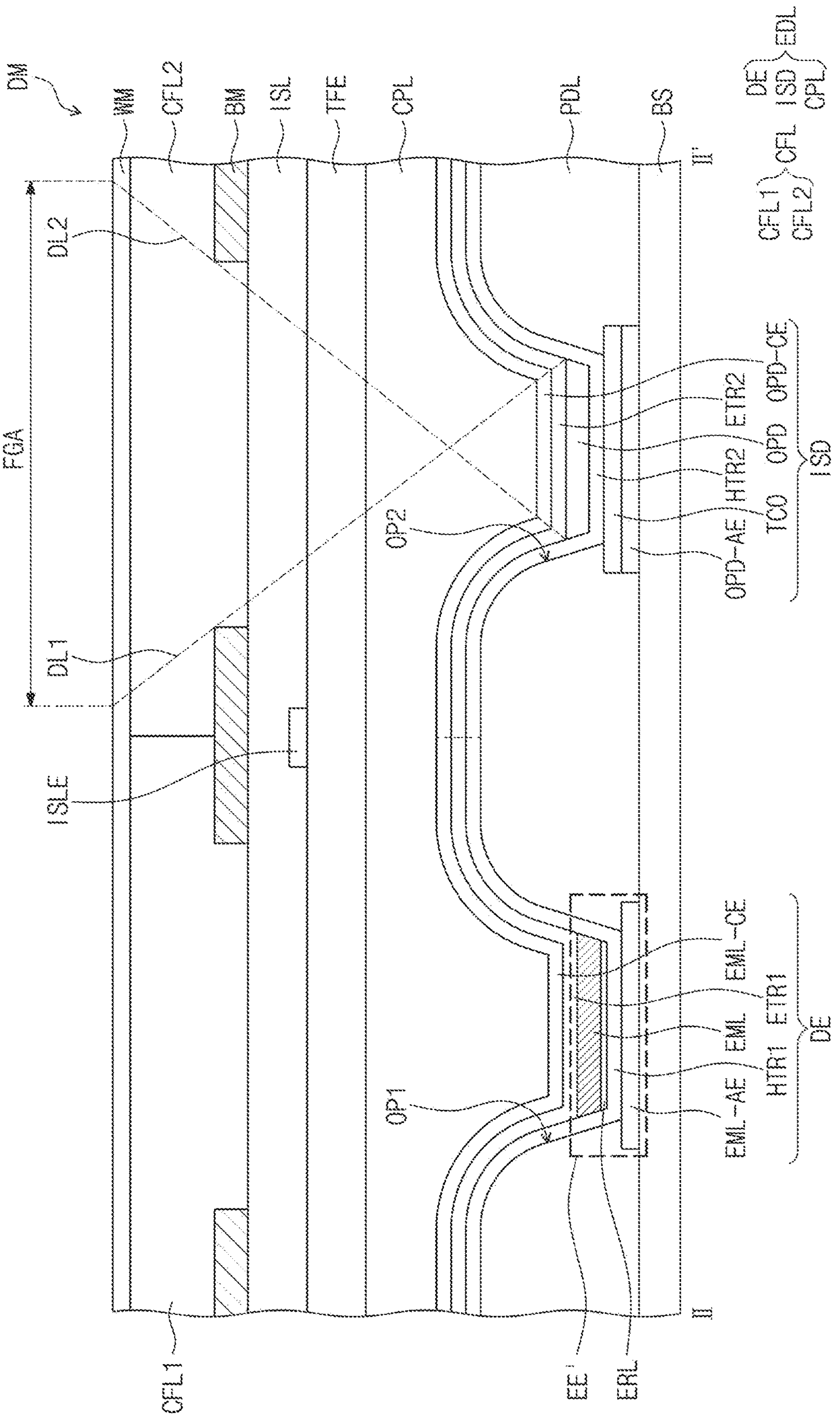
FIG. 5A is a cross-sectional view taken along the line II-II' of FIG. 4 according to an embodiment of the present disclosure.

FIG. 5A is a cross-sectional view taken along the line II-II' of FIG. 4 according to an embodiment of the present disclosure.

FIG. 5A shows a portion of the light emitting areas PXA-R, PXA-G, and PXA-B and the light receiving area ISA shown in FIG. 4. In other words, FIG. 5A is a cross-sectional view of a portion of the electronic device ED (e.g., refer to FIG. 3). For convenience of illustration, the circuit layer DP-CL from among the components shown in FIG. 3 is not shown in FIG. 5A.

Referring to FIGS. 3 and 5A, the electronic device ED may include the base layer BS. The base layer BS may be a member that provides a base surface on which a first light emitting electrode EML-AE and a first light receiving electrode OPD-AE are disposed. The base layer BS may be a glass substrate, a metal substrate, or a polymer substrate. However, the present disclosure is not limited thereto or thereby, and the base layer BS may be an inorganic layer, an organic layer, or a composite material layer.

The base layer BS may have a multi-layered structure. For example, the base layer BS may have a three-layered structure of a synthetic resin layer, an adhesive layer, and a synthetic resin layer. The synthetic resin layer may include a polyimide-based resin. In addition, the synthetic resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and/or a perylene-based resin. As used in the present disclosure, the term "X-based resin" refers to a resin that includes a functional group of X.

The element layer EDL may be disposed on the base layer BS. The element layer EDL may include the light emitting element DE and the light receiving element ISD.

As an example, the light emitting element DE included in the element layer EDL may include an organic light emitting element, a quantum dot light emitting element, a micro-LED, or a nano-LED. However, the present disclosure is not limited thereto or thereby. According to an embodiment, the light emitting element DE may be implemented in various suitable ways, as long as light is generated in response to the electrical signal or an amount of the light may be controlled.

The light receiving element ISD may be an optical sensor that receives and recognizes light reflected by the external object. In more detail, the light receiving element ISD may be an optical sensor that recognizes light in the visible light region, which is reflected by the external object. According to an embodiment, the light receiving element ISD may be a biometric sensor that recognizes light reflected from the user's body part, such as a fingerprint or vein, and converts an optical signal into the electrical signal.

The pixel definition layer PDL may be disposed on the base layer BS, and may be provided with openings OP1 and OP2 defined therethrough.

The light emitting element DE and the light receiving element ISD may be spaced apart (e.g., separated) and distinguished from each other with respect to the pixel definition layer PDL.

The pixel definition layer PDL may be provided with a first opening OP1 and a second opening OP2, which are defined therethrough. Components of the light emitting element DE may be disposed in the first opening OP1, and components of the light receiving element ISD may be disposed in the second opening OP2.

The pixel definition layer PDL may be disposed on the base layer BS. Portions of the upper surfaces of the first electrodes EML-AE and OPD-AE may be exposed through the openings OP1 and OP2. In the present embodiment, the light emitting areas PXA-R, PXA-G, and PXA-B and the light receiving area ISA may be defined to correspond to the first electrodes EML-AE and OPD-AE exposed through the openings OP1 and OP2. The first electrodes EML-AE and OPD-AE may include the first light emitting electrode EML-AE and the first light receiving electrode OPD-AE.

According to an embodiment, the pixel definition layer PDL may be formed of a polymer resin. As an example, the pixel definition layer PDL may include a polyacrylate-based resin or a polyimide-based resin. In addition, the pixel definition layer PDL may further include an inorganic material in addition to the polymer resin. The pixel definition layer PDL may include a light absorbing material, or may include a black pigment or a black dye. The pixel definition layer PDL including the black pigment or the black dye may be implemented as a black pixel definition layer. When the pixel definition layer PDL is formed, a carbon black may be used as the black pigment or the black dye. However, the present disclosure is not limited thereto or thereby.

In addition, the pixel definition layer PDL may include an inorganic material. As an example, the pixel definition layer PDL may include silicon nitride (SiNx), silicon oxide ($SiO_x$), or silicon oxynitride ($SiO_xN_y$).

The light emitting element DE shown in FIG. 5A may be disposed to correspond to one of the first light emitting area PXA-R, the second light emitting area PXA-G, and the third light emitting area PXA-B. Referring to FIGS. 4 and 5A, the light emitting element DE disposed corresponding to the first light emitting area PXA-R may emit red light, the light emitting element DE disposed corresponding to the second light emitting area PXA-G may emit green light, and the light emitting element DE disposed corresponding to the third light emitting area PXA-B may emit blue light.

According to an embodiment, the light emitting element DE may include the first light emitting electrode EML-AE, the second light emitting electrode EML-CE, and the light emitting layer EML disposed between the first light emitting electrode EML-AE and the second light emitting electrode EML-CE. At least a portion of the upper surface of the first light emitting electrode EML-AE may be exposed through the first opening OP1.

According to an embodiment, the light receiving element ISD may include the first light receiving electrode OPD-AE, the second light receiving electrode OPD-CE, and the light receiving layer OPD. At least a portion of an upper surface of the first light receiving electrode OPD-AE may be exposed through the second opening OP2.

In the element layer EDL, the first electrodes EML-AE and OPD-AE may be formed of a metal material, a metal alloy, or a conductive compound. The first electrodes EML-AE and OPD-AE may be an anode or a cathode. However, the present disclosure is not limited thereto or thereby. In addition, the first electrodes EML-AE and OPD-AE may be a pixel electrode or a sensing electrode. The first electrodes EML-AE and OPD-AE may be a transmissive electrode, a transflective electrode, or a reflective electrode. When the first electrodes EML-AE and OPD-AE are the transmissive electrode, the first electrodes EML-AE and OPD-AE may include a transparent metal oxide, for example, such as indium tin oxide (ITO), indium zinc oxide (IZO), zinc oxide (ZnO), indium tin zinc oxide (ITZO), and/or the like. When the first electrodes EML-AE and OPD-AE are the transflective electrode or the reflective electrode, the first electrodes EML-AE and OPD-AE may include Ag, Mg, Cu, Al, Pt, Pd, Au, Ni, Nd, Ir, Cr, Li, Ca, LiF/Ca, LiF/Al, Mo, Ti, W, a suitable compound thereof, or a suitable mixture thereof, for example, such as a mixture of Ag and Mg.

The second electrodes EML-CE and OPD-CE may be a common electrode. The second electrodes EML-CE and OPD-CE may be the cathode or the anode. However, the present disclosure is not limited thereto or thereby. As an example, when the first electrodes EML-AE and OPD-AE are the anode, the second electrodes EML-CE and OPD-CE may be the cathode, and when the first electrodes EML-AE and OPD-AE are the cathode, the second electrodes EML-CE and OPD-CE may be the anode.

The second electrodes EML-CE and OPD-CE may be the transmissive electrode, the transflective electrode, or the reflective electrode. When the second electrodes EML-CE and OPD-CE are the transmissive electrode, the second electrodes EML-CE and OPD-CE may include a transparent metal oxide, for example, such as indium tin oxide (ITO), indium zinc oxide (IZO), zinc oxide (ZnO), indium tin zinc oxide (ITZO), and/or the like. When the second electrodes EML-CE and OPD-CE are the transflective electrode or the reflective electrode, the second electrodes EML-CE and OPD-CE may include Ag, Mg, Cu, Al, Pt, Pd, Au, Ni, Nd, Ir, Cr, Li, Ca, LiF/Ca, LiF/Al, Mo, Ti, Yb, W, a suitable compound thereof, or a suitable mixture thereof, for example, such as AgMg, AgYb, or MgYb.

The first electrodes EML-AE and OPD-AE included in the element layer EDL may be the transflective electrode or the reflective electrode, and the second electrodes EML-CE and OPD-CE AE included in the element layer EDL may be the transmissive electrode or the transflective electrode. In other words, according to an embodiment, the element layer EDL may include the transmissive or transflective second electrodes EML-CE and OPD-CE, and thus, light reflected by the external object may be easily transmitted to the light receiving element ISD.

The light emitting layer EML of the light emitting element DE may be disposed in the first opening OP1. The light emitting layer EML may include an organic light emitting material or a quantum dot material.

The light receiving layer OPD of the light receiving element ISD may be disposed in the second opening OP2. The light receiving layer OPD may include a light receiving material that receives light, and converts the received light to an electrical signal. As an example, the light receiving layer OPD may include an organic light receiving material. According to an embodiment, the light receiving layer OPD may include an organic polymer material as the light receiving material. As an example, the light receiving layer OPD may include a conjugated polymer. The light receiving layer OPD may include a thiophene-based conjugated polymer, a benzodithiophene-based conjugated polymer, a thieno [3,4-c]pyrrole-4,6-dione (TPD)-based conjugated polymer, a diketo-pyrrole-pyrrole (DPP)-based conjugated polymer, a benzothia Diazole (BT)-based conjugated polymer, and/or the like. However, the present disclosure is not limited thereto or thereby.

According to an embodiment, the light receiving element ISD may sense light of a suitable wavelength (e.g., a specific or predetermined wavelength). As an example, the light receiving element ISD may sense light having the wavelength equal to or greater than about 450 nm and equal to or smaller than about 2500 nm. However, the present disclosure is not limited thereto or thereby. As an example, the light receiving element ISD may sense light having a wavelength equal to or greater than about 495 nm and equal to or smaller than about 570 nm, and an absorption center wavelength may be about 530 nm. In other words, the light receiving element ISD may sense green light.

According to an embodiment, the light receiving element ISD may further include an optical compensation layer TCO.

The optical compensation layer TCO may be disposed between the first light receiving electrode OPD-AE and the light receiving layer OPD, and may not overlap with the first light emitting electrode EML-AE when viewed in the plane (e.g., in a plan view). As used herein, when one component is referred to as not overlapping with another component when viewed in the plane (e.g., in a plan view), the two components may not overlap with each other when viewed in the plane defined by the first directional axis DR1 and the second directional axis DR2. In other words, the expression "the optical compensation layer TCO does not overlap with the first light emitting electrode EML-AE when viewed in the plane (e.g., in a plan view)" means that there is no overlapping area between the first light emitting electrode EML-AE and the optical compensation layer TCO when viewed on the plane (e.g., in a plan view).

The optical compensation layer TCO may be disposed directly on the first light receiving electrode OPD-AE. The optical compensation layer TCO may be disposed to be in contact with an upper surface of the first light receiving electrode OPD-AE.

The optical compensation layer TCO may have a thickness equal to or greater than about 250 Å and equal to or smaller than about 330 Å. A hole transport region HTR may have a thickness equal to or greater than about 1150 Å and equal to or smaller than about 1250 Å. As an example, when the optical compensation layer TCO includes indium zinc oxide (IZO), the optical compensation layer TCO may have the same or substantially the same thickness as the thickness equal to or greater than about 250 Å and equal to or smaller than about 310 Å. When the optical compensation layer TCO includes indium tin oxide (ITO), the optical compensation layer TCO may have the same or substantially the same thickness as the thickness equal to or greater than about 270 Å and equal to or smaller than about 330 Å. However, the present disclosure is not limited thereto or thereby.

According to an embodiment, the optical compensation layer TCO may have an optical transmittance equal to or greater than about 80%, and an electrical conductivity equal to or smaller than about $10^{-3}$ Ωcm.

The optical compensation layer TCO may include a transparent conductive oxide. As an example, the optical compensation layer TCO may include at least one of indium tin oxide (ITO), indium zinc oxide (IZO), indium gallium zinc oxide (IGZO), tin oxide (TO), zinc oxide (ZO), gallium-doped zinc oxide (GZO), and/or aluminum-doped zinc oxide (AZO). However, the present disclosure is not limited thereto or thereby.

The element layer EDL may further include the hole transport region HTR and an electron transport region ETR. The hole transport region HTR may include a first hole transport region HTR1 and a second hole transport region HTR2, and the electron transport region ETR may include a first electron transport region ETR1 and a second electron transport region ETR2.

The element layer EDL may include the first hole transport region HTR1 disposed between the first light emitting electrode EML-AE and the light emitting layer EML, the first electron transport region ETR1 disposed between the light emitting layer EML and the second light emitting electrode EML-CE, the second hole transport region HTR2 disposed between the first light receiving electrode OPD-AE and the light receiving layer OPD, and the second electron transport region ETR2 disposed between the light receiving layer OPD and the second light receiving electrode OPD-CE. According to an embodiment, the first hole transport region HTR1 may be provided integrally with the second hole transport region HTR2, and the first electron transport region ETR1 may be provided integrally with the second electron transport region ETR2. In other words, the first hole transport region HTR1 and the second hole transport region HTR2 may be integrally connected to each other to provide the hole transport region HTR, and the first electron transport region ETR1 and the second electron transport region ETR2 may be integrally connected to each other to provide the electron transport region ETR. Each of the hole transport region HTR and the electron transport region ETR may be provided as a common layer.

According to an embodiment, the hole transport region HTR forming the light emitting element DE and the light receiving element ISD may have a single-layer structure of a single material, a single-layer structure of a plurality of different materials, or a multi-layered structure of a plurality of layers formed of a plurality of different materials. As an example, the hole transport region HTR may have a single-layer structure of a hole injection layer or a hole transport layer, or a single-layer structure of a hole injection material or a hole transport material. According to an embodiment, the hole transport region HTR included in the light emitting element DE and the light receiving element ISD may include a hole transport layer, and may further include a hole injection layer.

Figure 5B:
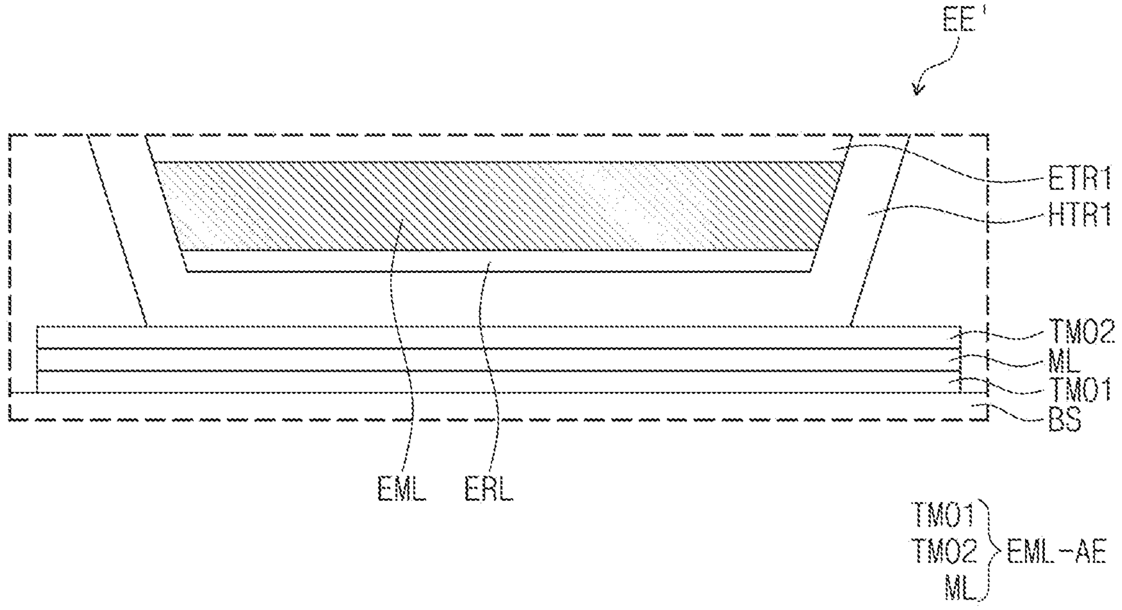
FIG. 5B is an enlarged view of the area EE' of FIG. 5A.

FIG. 5B is an enlarged view of the area EE' of FIG. 5A.

Referring to FIGS. 5A and 5B, the light emitting element DE may further include a light emitting compensation layer ERL disposed between the first hole transport region HTR1 and the light emitting layer EML.

The light emitting compensation layer ERL may include a hole transport material.

The light emitting compensation layer ERL may include the same or substantially the same material as that of the first hole transport region HTR1, and the entire thickness of the light emitting element DE may be adjusted using the light emitting compensation layer ERL, thereby controlling a resonance distance. As an example, the light emitting compensation layer ERL may have a thickness of about 350 Å, but the present disclosure is not limited thereto or thereby.

The first electrodes EML-AE and OPD-AE may include a first transparent metal oxide layer TMO1, a metal layer ML disposed on the first transparent metal oxide layer TMO1, and a second transparent metal oxide layer TMO2 disposed on the metal layer ML.

The transparent metal oxide layers TMO1 and TMO2 may include indium tin oxide (ITO), indium zinc oxide (IZO), zinc oxide (ZnO), indium tin zinc oxide (ITZO), and/or the like.

The metal layer ML may include Ag, Mg, Cu, Al, Pt, Pd, Au, Ni, Nd, Ir, Cr, Li, Ca, LiF/Ca, LiF/Al, Mo, Ti, Yb, W, a suitable compound thereof, or a suitable mixture thereof, for example, such as AgMg, AgYb, or MgYb.

In the case where the second transparent metal oxide layer TMO2 of the first light receiving electrode OPD-AE includes the transparent conductive oxide, the optical compensation layer TCO may include the same or substantially the same material as or a material different from that of the second transparent metal oxide layer TMO2. As an example, the second transparent metal oxide layer TMO2 may include indium tin oxide (ITO), and the optical compensation layer TCO may include indium zinc oxide (IZO). According to an embodiment, each of the second transparent metal oxide layer TMO2 and the optical compensation layer TCO may include indium tin oxide (ITO). The optical compensation layer TCO and the first light receiving electrode OPD-AE may be distinguished from each other, and an interface may be defined between the optical compensation layer TCO and the first light receiving electrode OPD-AE. An interface may be defined between the optical compensation layer TCO and the second transparent metal oxide layer TMO2.

According to an embodiment, the electron transport region ETR forming the light emitting element DE and the light receiving element ISD may have a single-layer structure of a single material, a single-layer structure of a plurality of different materials, or a multi-layered structure of a plurality of layers formed of a plurality of different materials. As an example, the electron transport region ETR may have a single-layer structure of an electron injection layer or an electron transport layer, or a single-layer structure of an electron injection material or an electron transport material. In addition, the electron transport region ETR may have a single-layer structure of a plurality of different materials, or may include a plurality of layers sequentially stacked on one another from the light emitting layer EML. According to an embodiment, the electron transport region ETR included in the light emitting element DE and the light receiving element ISD may include a transport layer, and may further include an injection layer.

According to an embodiment, the element layer EDL may further include a capping layer CPL.

The capping layer CPL may be disposed on the second light emitting electrode EML-CE and the second light receiving electrode OPD-CE.

The capping layer CPL may improve light emission efficiency by the principle of constructive interference. The capping layer CPL may include a suitable material having a refractive index equal to or greater than about 1.6 with respect to light with a wavelength of about 589 nm. The capping layer CPL may be an organic capping layer including an organic material, an inorganic capping layer including an inorganic material, or a composite capping layer including the organic material and the inorganic material. For example, the capping layer CPL may include carbocyclic compounds, heterocyclic compounds, amine group-containing compounds, porphine derivatives, phthalocyanine derivatives, naphthalocyanine derivatives, alkali metal complexes, alkaline earth metal complexes, or any suitable combination thereof. The carbocyclic compounds, the heterocyclic compounds, and the amine group-containing compounds may optionally be substituted with substituents including O, N, S, Se, Si, F, Cl, Br, I, or any suitable combination thereof.

The display module DM may further include the encapsulation layer TFE.

The encapsulation layer TFE may be disposed on the element layer EDL, and may cover the light emitting element DE and the light receiving element ISD.

The encapsulation layer TFE may include at least one inorganic layer and at least one organic layer. As an example, the encapsulation layer TFE may include at least two inorganic layers, and one or more organic layers disposed between the inorganic layers. The encapsulation layer TFE may include a plurality of inorganic layers and a plurality of organic layers, which are sequentially stacked.

An encapsulation inorganic layer may protect the light emitting element DE and the light receiving element ISD from moisture and oxygen. An encapsulation organic layer may protect the light emitting element DE and the light receiving element ISD from foreign substances, such as dust particles. The encapsulation inorganic layer may include a silicon nitride layer, a silicon oxynitride layer, a silicon oxide layer, a titanium oxide layer, or an aluminum oxide layer, but the present disclosure is not limited thereto or thereby. The encapsulation organic layer may include an acrylic-based organic layer, but the present disclosure is not limited thereto or thereby.

The display module DM may further include the input sensing layer ISL.

The input sensing layer ISL may be disposed on the encapsulation layer TFE, and may sense an external input applied thereto from the outside. The external input may be a user input. The user input may include a variety of suitable external inputs, such as a part of user's body, light, heat, pen, and/or pressure.

The input sensing layer ISL may include an input sensing electrode ISLE.

The input sensing electrode ISLE may not overlap with the light emitting element DE and the light receiving element ISD when viewed in the plane (e.g., in a plan view). The input sensing electrode ISLE may be disposed to overlap with the non-light-emitting area NPXA.

The input sensing layer ISL may include (e.g., may be) an inorganic layer including at least one of silicon nitride, silicon oxynitride, and/or silicon oxide. According to an embodiment, the input sensing layer ISL may include (e.g., may be) an organic layer including an epoxy resin, an acrylic resin, or an imide-based resin.

The input sensing electrode ISLE may have a single-layer structure of a single conductive layer, or a multi-layered structure of a plurality of layers stacked on one another in the third directional axis DR3.

The conductive layer having the single-layer structure may include a metal layer or a transparent conductive layer. The metal layer may include molybdenum, silver, titanium, copper, aluminum, or a suitable alloy thereof. The transparent conductive layer may include a transparent conductive oxide, such as indium tin oxide (ITO), indium zinc oxide (IZO), zinc oxide (ZnO), indium zinc tin oxide (IZTO), or the like. In addition, the transparent conductive layer may include a conductive polymer such as PEDOT, a metal nanowire, graphene, or the like.

The conductive layer having the multi-layered structure may include a plurality of metal layers. The metal layers may have a three-layered structure of titanium/aluminum/titanium. The conductive layer having the multi-layered structure may include at least one metal layer and at least one transparent conductive layer.

The light emitting element DE may not overlap with the light receiving element ISD when viewed in the plane (e.g., in a plan view).

The display module DM may further include a color filter layer CFL disposed on the input sensing layer ISL.

The color filter layer CFL may selectively transmit light in a desired wavelength range (e.g., a specific or predetermined wavelength range). As an example, a portion of the color filter layer CFL may selectively transmit light having a wavelength range of about 450 nm to about 2500 nm. The portion of the color filter layer CFL may selectively transmit light in the same or substantially the same wavelength range as the wavelength range of the light absorbed by the light receiving element ISD. Accordingly, the light in the desired wavelength range may be selectively incident on the light receiving element ISD by the color filter layer CFL, and a sensing sensitivity of the light receiving element ISD may be improved.

The color filter layer CFL may include a first color filter layer CFL1 disposed corresponding to the light emitting areas PXA-R, PXA-G, and PXA-B, and a second color filter layer CFL2 disposed corresponding to the light receiving area ISA.

The color filter layer CFL may further include a light blocking portion BM disposed corresponding to the non-light-emitting area NPXA.

The light blocking portion BM may have a black color, and may include a black coloring agent. The black coloring agent may include a black dye or a black pigment. The black coloring agent may include a metal material, such as carbon black, chromium, or an oxide thereof.

The display module DM may include a fingerprint acquisition area FGA defined therein.

Referring to FIG. 5A, the fingerprint acquisition area FGA may be defined as an area between intersections of each of a first straight line DL1 and a second straight line DL2 and the upper surface of the window member WM. The first straight line DL1 and the second straight line DL2 may be imaginary index lines respectively extending from one end and another end (e.g., an opposite end) of the light receiving layer OPD to be in contact with the light blocking portion BM.

The light receiving layer OPD may absorb light IP-L (e.g., refer to FIG. 6) incident thereto through the fingerprint acquisition area FGA.

Figure 6:
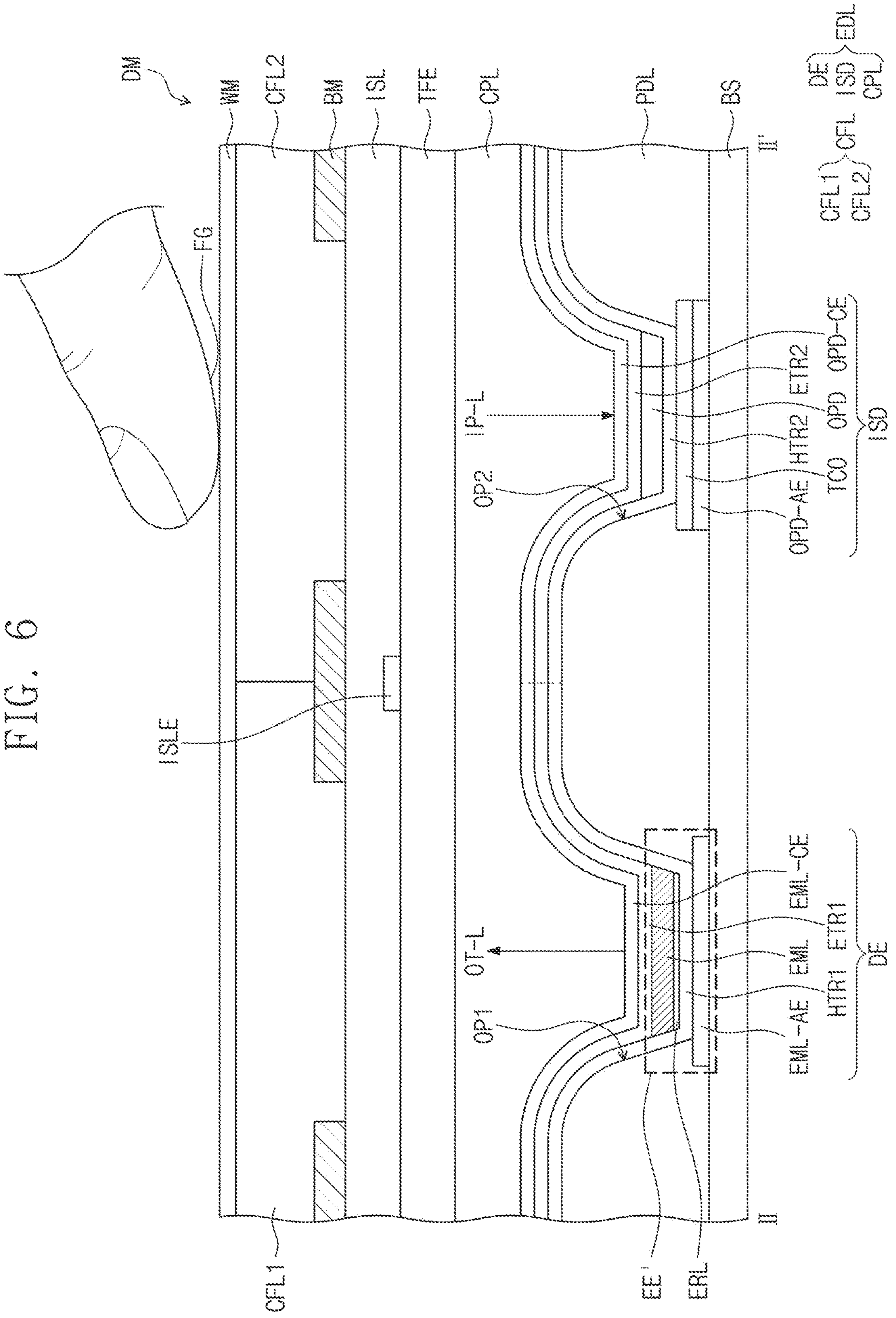
FIG. 6 is a cross-sectional view taken along the line II-II' of FIG. 4 according to an embodiment of the present disclosure.

FIG. 6 is a cross-sectional view taken along the line II-II' of FIG. 4 according to an embodiment of the present disclosure. FIG. 6 shows a state in which the fingerprint FG, which is the external input, is recognized.

Referring to FIGS. 5A and 6, emission light OT-L emitted from the light emitting element DE included in the element layer EDL of the display module DM may be reflected by the external object, for example, such as the fingerprint FG, and may be incident to the light receiving element ISD included in the element layer EDL through the fingerprint acquisition area FGA as reflection light IP-L. The reflection light IP-L incident to the light receiving element ISD through the fingerprint acquisition area FGA may be in a wavelength range equal to or greater than about 495 nm and equal to or smaller than about 2500 nm, but the present disclosure is not limited thereto. As an example, the reflection light IP-L incident to the light receiving element ISD through the fingerprint acquisition area FGA may be in a wavelength range equal to or greater than about 495 nm and equal to or smaller than about 570 nm. The light receiving element ISD may receive the incident light, may convert the received light into an electrical signal to recognize the external input, and may change a driving state of the electronic device ED. The light receiving element ISD may have an external quantum efficiency of about 50% or more and about 62% or less with respect to the reflection light IP-L. As an example, in the case where the optical compensation layer TCO of the light receiving element ISD includes indium zinc oxide (IZO), the light receiving element ISD may have an external quantum efficiency of about 62% or less with respect to the reflection light IP-L. In the case where the optical compensation layer TCO of the light receiving element ISD includes indium tin oxide (ITO), the light receiving element ISD may have an external quantum efficiency of about 59.7% with respect to the reflection light IP-L. However, the present disclosure is not limited to these examples.

Figure 7:
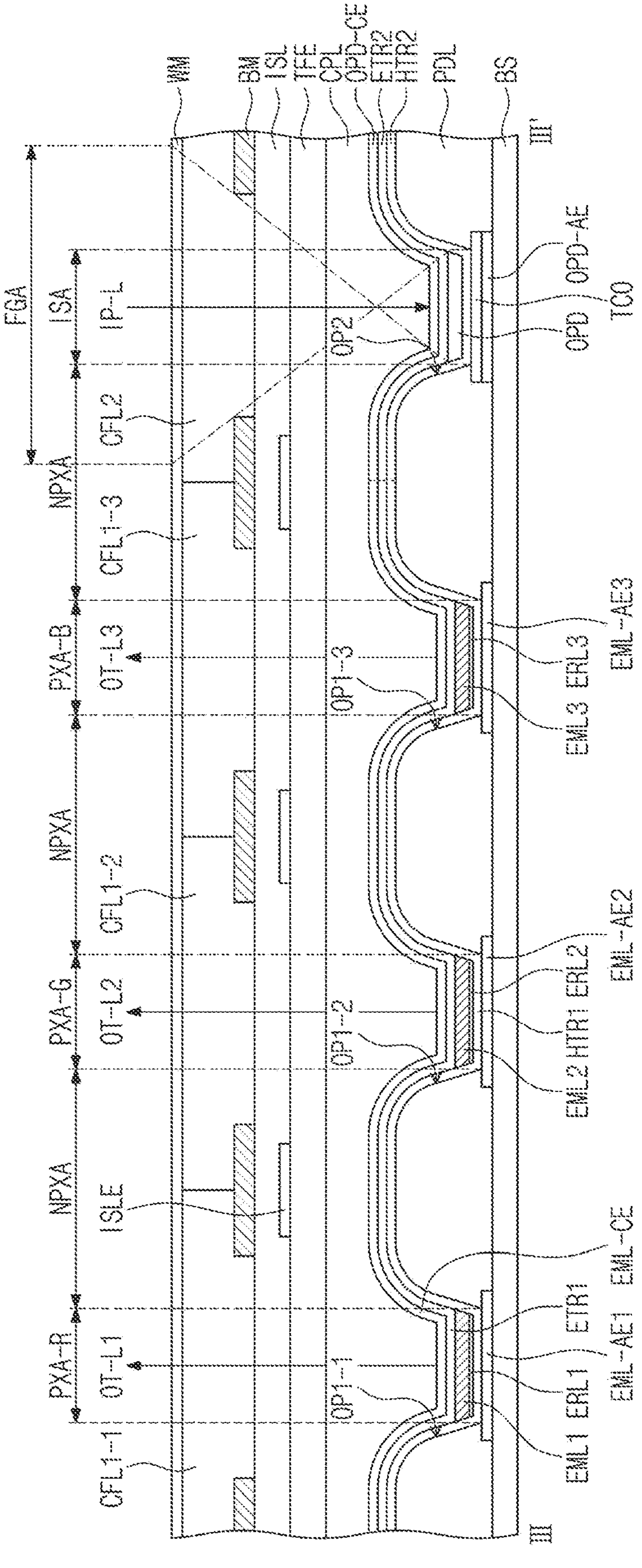
FIG. 7 is a cross-sectional view taken along the line III-III' of FIG. 4 according to an embodiment of the present disclosure.

FIG. 7 is a cross-sectional view taken along the line III-III' of FIG. 4 according to an embodiment of the present disclosure. The following description of the display module DM hereinafter with reference to FIG. 7 may be focused on the differences from the display module DM described above with reference to FIG. 5A, and thus, redundant description therebetween may not be repeated.

Referring to FIG. 7, the display module DM may include a first light emitting area PXA-R, a second light emitting area PXA-G, a third light emitting area PXA-B, a non-light-emitting area NPXA, a light receiving area ISA, and a fingerprint acquisition area FGA.

The display module DM may include a base layer BS.

A first light emitting electrode EML-AE may include a first-first light emitting electrode EML-AE1 disposed on the base layer BS to correspond to the first light emitting area PXA-R, a first-second light emitting electrode EML-AE2 disposed on the base layer BS to correspond to the second light emitting area PXA-G, and a first-third light emitting electrode EML-AE3 disposed on the base layer BS to correspond to the third light emitting area PXA-B.

A first light emitting compensation layer ERL1 may be disposed between a first hole transport region HTR1 and a first light emitting layer EML1. A second light emitting compensation layer ERL2 may be disposed between the first hole transport region HTR1 and a second light emitting layer EML2. A third light emitting compensation layer ERL3 may be disposed between the first hole transport region HTR1 and a third light emitting layer EML3.

A first light receiving electrode OPD-AE may be disposed on the base layer BS to correspond to the light receiving area ISA.

The display module DM may further include an optical compensation layer TCO disposed directly on the first light receiving electrode OPD-AE.

The optical compensation layer TCO may not overlap with the first-first light emitting electrode EML-AE1, the first-second light emitting electrode EML-AE2, and the first-third light emitting electrode EML-AE3.

The display module DM may further include a hole transport region HTR, a light emitting layer EML, a light receiving layer OPD, and an electron transport region ETR.

Hole transport regions HTR1 and HTR2 may include the first hole transport region HTR1 disposed on the first-first light emitting electrode EML-AE1, the first-second light emitting electrode EML-AE2, and the first-third light emitting electrode EML-AE3, and a second hole transport region HTR2 disposed on the optical compensation layer TCO.

The first hole transport region HTR1 may be provided integrally with the second hole transport region HTR2. In other words, the first hole transport region HTR1 may be connected to the second hole transport region HTR2 to provide the hole transport regions HTR1 and HTR2 that are integrally formed with each other, and thus, the hole transport regions HTR1 and HTR2 may serve as a common layer.

The light emitting layer EML may include the first light emitting layer EML1 disposed on the first hole transport region HTR1 to correspond to the first light emitting area PXA-R, the second light emitting layer EML2 disposed on the first hole transport region HTR1 to correspond to the second light emitting area PXA-G, and the third light emitting layer EML3 disposed on the first hole transport region HTR1 to correspond to the third light emitting area PXA-B.

The light receiving layer OPD may be disposed on the second hole transport region HTR2.

The electron transport region ETR may include a first electron transport region ETR1 disposed on the first light emitting layer EML1, the second light emitting layer EML2, and the third light emitting layer EML3, and a second electron transport region ETR2 disposed on the light receiving layer OPD.

The first electron transport region ETR1 may be provided integrally with the second electron transport region ETR2. In other words, the first electron transport region ETR1 may be connected to the second electron transport region ETR2 to provide the electron transport regions ETR1 and ETR2 that are integrally formed, and thus, the electron transport regions ETR1 and ETR2 may serve as a common layer.

The display module DM may further include second electrodes EML-CE and OPD-CE disposed on the electron transport region ETR.

The display module DM may further include a capping layer CPL disposed on the second electrodes EML-CE and OPD-CE, an encapsulation layer TFE disposed on the capping layer CPL, an input sensing layer ISL disposed on the encapsulation layer TFE and including an input sensing electrode ISLE disposed corresponding to the non-light-emitting area NPXA, and a color filter layer CFL disposed on the input sensing layer ISL.

The second electrodes EML-CE and OPD-CE, the encapsulation layer TFE, the input sensing electrode ISLE, and the input sensing layer ISL may be the same or substantially the same as those described above with reference to FIG. 5A, and thus, redundant description thereof will not be repeated.

The color filter layer CFL may selectively transmit light in a desired wavelength range (e.g., a specific or predetermined wavelength range). As an example, a portion of the color filter layer CFL may selectively transmit light having a wavelength range of about 450 nm to about 2500 nm. The portion of the color filter layer CFL may selectively transmit light in the same or substantially the same wavelength range as the wavelength range of the light absorbed by the light receiving element ISD. Accordingly, the light in the specific wavelength range may be selectively incident to the light receiving element ISD by the color filter layer CFL, and a sensing sensitivity of the light receiving element ISD may be improved.

The color filter layer CFL may include a first-first color filter layer CFL1-1 disposed corresponding to the first light emitting area PXA-R, a first-second color filter layer CFL1-2 disposed corresponding to the second light emitting area PXA-G, a first-third color filter layer CFL1-3 disposed corresponding to the third light emitting area PXA-B, and a second color filter layer CFL2 disposed corresponding to the light receiving area ISA.

The color filter layer CFL may further include a light blocking portion BM.

The light blocking portion BM may have a black color, and may include a black coloring agent. The black coloring agent may include a black dye or a black pigment. The black coloring agent may include a metal material, such as carbon black, chromium, or an oxide thereof.

The first light emitting layer EML1 may emit first-first light OT-L1 traveling from the first-first light emitting electrode EML-AE1 to the first hole transport region HTR1. The second light emitting layer EML2 may emit first-second light OT-L2 traveling from the first-second light emitting electrode EML-AE2 to the first hole transport region HTR1. The third light emitting layer EML3 may emit first-third light OT-L3 traveling from the first-third light emitting electrode EML-AE3 to the first hole transport region HTR1.

The first-first light OT-L1 may have a wavelength range equal to or greater than about 620 nm and equal to or smaller than about 750 nm. The first-second light OT-L2 may have a wavelength range equal to or greater than about 495 nm and equal to or smaller than about 570 nm. The first-third light OT-L3 may have a wavelength range equal to or greater than about 450 nm and equal to or smaller than about 495 nm. However, the present disclosure is not limited to the above examples.

The first-first color filter layer CFL1-1 may transmit the first-first light OT-L1, the first-second color filter layer CFL1-2 may transmit the first-second light OT-L2, the first-third color filter layer CFL1-3 may transmit the first-third light OT-L3, and the second color filter layer CFL2 may transmit the second light IP-L.

The light receiving layer OPD may absorb the second light IP-L traveling from the second electron transport region ETR2 to the light receiving layer OPD in the fingerprint acquisition area FGA.

The second light IP-L may have a wavelength range equal to or greater than about 495 nm and equal to or smaller than about 570 nm. As an example, an absorption center wavelength may be about 530 nm. In other words, the first-second light OT-L2 and the second light IP-L may have the same or substantially the same wavelength range as each other, but the present disclosure is not limited thereto.

The first-first color filter layer CFL1-1 may transmit light having a wavelength equal to or greater than about 620 nm and equal to or smaller than about 750 nm. The first-second color filter layer CFL1-2 may transmit light having a wavelength equal to or greater than about 495 nm and equal to or smaller than about 570 nm. The first-third color filter layer CFL1-3 may transmit light having a wavelength equal to or greater than about 450 nm and equal to or smaller than about 495 nm. The second color filter layer CFL2 may transmit light having a wavelength equal to or greater than about 450 nm and equal to or smaller than about 2500 nm. However, the present disclosure is not limited to the above examples.

Hereinafter, a light receiving element included in a display module (e.g., a display or a display device) according to one or more example embodiments of the present disclosure and a comparative example will be described in more detail based on detailed data of element characteristics. The one or more example embodiments shown below are to help with comprehension of the embodiments of the present disclosure, and thus, the spirit and scope of the present disclosure is not limited thereto or thereby.

Table 1 below shows a resonance thickness and an external quantum efficiency of the comparative example, embodiment example 1, and embodiment example 2.

The light receiving element may receive the incident light incident thereto through the light receiving layer, may convert the received light into the electrical signal to recognize the external input, and may change the driving state of the electronic device ED. Therefore, as the external quantum efficiency of the light receiving layer increases, the sensing sensitivity may be improved (e.g., may become excellent).

When compared with the display module shown in FIG. 7, the display module according to the comparative example does not include the optical compensation layer, and includes the light emitting compensation layer disposed between a first hole transport region and a first light emitting layer, between the first hole transport region and a second light emitting layer, between the first hole transport region and a third light emitting layer, and between a second hole transport region and a light receiving layer. Portions of the light emitting compensation layer of the display module according to the comparative example, which respectively overlap with a first light emitting area, a second light emitting area, and a third light emitting area, have different thicknesses from each other, and the thickness of the portion of the light emitting compensation layer, which overlaps with a light receiving area, is the same as the thickness of the portion of the light emitting compensation layer, which overlaps with the second light emitting area. In other words, when the display module according to the comparative example is formed, the light emitting compensation layer overlapping with the second light emitting area and the light receiving area overlapping with the light emitting compensation layer are formed through the same process.

The display module according to embodiment example 1 has the structure of the display module shown in FIG. 7, and the optical compensation layer is manufactured to include indium zinc oxide (IZO).

The display module according to embodiment example 2 has the structure of the display module shown in FIG. 7, and the optical compensation layer is manufactured to include indium tin oxide (ITO).

The light emitting compensation layers of the comparative example, embodiment example 1, and embodiment example 2 have the same resonance thickness of about 350 Å, and the hole transport regions of the comparative example, embodiment example 1, and embodiment example 2 have the same resonance thickness of about 1200 Å.

In the comparative example, embodiment example 1, and embodiment example 2, the center absorption wavelength of the light absorbed by each light receiving layer is about 530 nm.

TABLE 1

| | | Comparative example | Embodiment example 1 | Embodiment example 2 |
|---|---|---|---|---|
| Resonance thickness | light emitting compensation layer | 350 Å | 350 Å | 350 Å |
| | optical compensation layer | — | 280 Å IZO | 300 Å ITO |
| | hole transport region | 1200 Å | 1200 Å | 1200 Å |
| External Quantum Efficiency | first light emitting layer | 100% | 100% | 100% |
| | second light emitting layer | 100% | 100% | 100% |
| | third light emitting layer | 100% | 100% | 100% |
| | light receiving layer | 62.2% | 62.0% | 59.7% |

According to Table 1, the external quantum efficiency of the light receiving layer of embodiment example 1 and embodiment example 2 was reduced by about 0.2% p and about 2.5% p, respectively, and the external quantum efficiency of the light receiving layer of the embodiment examples 1 and 2 is the same as compared with the light receiving layer of the comparative example. Accordingly, there is no substantial difference in sensing sensitivity between the comparative example, embodiment example 1, and embodiment example 2. In the case of the display module of the comparative example, the light emitting compensation layers respectively corresponding to the second light emitting area and the light receiving area are formed through the same process as described above. In this case, a patterning process is performed using a fine metal mask (FMM) provided with an opening in each of the second light emitting area and the light receiving area. However, when a high-resolution display module is formed, a mask is required to be designed so that a light emitting compensation layer pattern formed in each of areas corresponding to the first light emitting area and the third light emitting area does not overlap with a light emitting compensation layer pattern formed in the second light emitting area and the light receiving area as a single unitary form. As a result, the processes are complicated, and the difficulty of manufacturing the display module is excessively high.

In addition, because the portion of the light emitting compensation layer overlapping with the light receiving area and the portion of the light emitting compensation layer overlapping with the second light emitting area are formed through the same process in the display module of the comparative example, the lateral leakage current occurs through the light emitting compensation layer between the light emitting element of the second light emitting area and the light receiving element.

Unlike in the comparative example, according to embodiment example 1 and embodiment example 2, the light emitting compensation layer does not overlap with the light receiving area, and the optical compensation layer rather than the light emitting compensation layer may be disposed on the first light receiving electrode. Accordingly, when compared with the comparative example, embodiment example 1 and embodiment example 2 have no substantial difference in the sensing sensitivity of the light receiving layer, and do not require a complicated mask process when forming the display module, and thus, the difficulty of the display module manufacturing process may be lowered.

In addition, when compared with the comparative example, the light emitting compensation layer does not overlap with the light receiving area in embodiment example 1 and embodiment example 2, and the lateral leakage current does not occur between the light emitting element and the light receiving element through the light emitting compensation layer. Thus, the efficiency of the light emitting element may be improved.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display module comprising:
a base layer;
a pixel definition layer on the base layer, and having a first opening and a second opening; and
an element layer comprising:
a light emitting element corresponding to the first opening, and comprising:
a first light emitting electrode on the base layer;
a light emitting layer on the first light emitting electrode; and
a second light emitting electrode on the light emitting layer; and
a light receiving element corresponding to the second opening, and distinguished from the light emitting element by the pixel definition layer,
wherein the light receiving element comprises:
a first light receiving electrode on the base layer;
a light receiving layer on the first light receiving electrode;
a second light receiving electrode on the light receiving layer; and
an optical compensation layer between the first light receiving electrode and the light receiving layer, and not overlapping with the first light emitting electrode in a plan view, and
wherein the optical compensation layer comprises a transparent conductive oxide.

2. The display module of claim 1, wherein the optical compensation layer has a thickness equal to or greater than about 250 angstroms and equal to or smaller than about 330 angstroms.

3. The display module of claim 1, wherein the optical compensation layer has an optical transmittance equal to or greater than about 80%, and an electrical conductivity equal to or smaller than about $10^{-3}$ Ω*cm.

4. The display module of claim 1, wherein the optical compensation layer comprises at least one of indium tin oxide (ITO), indium zinc oxide (IZO), indium gallium zinc oxide (IGZO), tin oxide (TO), zinc oxide (ZO), gallium-doped zinc oxide (GZO), or aluminum-doped zinc oxide (AZO).

5. The display module of claim 1, wherein the light emitting element further comprises:
a first hole transport region between the first light emitting electrode and the light emitting layer; and
a first electron transport region between the light emitting layer and the second light emitting electrode,
wherein the light receiving element further comprises:
a second hole transport region between the optical compensation layer and the light receiving layer; and
a second electron transport region between the light receiving layer and the second light receiving electrode, and
wherein the first hole transport region is integral with the second hole transport region, and the first electron transport region is integral with the second electron transport region.

6. The display module of claim 5, wherein the element layer further comprises a capping layer on the second light emitting electrode and the second light receiving electrode.

7. The display module of claim 6, further comprising:
an encapsulation layer on the element layer to cover the light emitting element and the light receiving element; and
an input sensing layer on the encapsulation layer,
wherein the encapsulation layer comprises at least one organic layer and at least one inorganic layer, and
wherein the input sensing layer comprises an input sensing electrode located to not overlap with the light emitting element and the light receiving element in a plan view.

8. The display module of claim 7, wherein the light emitting element does not overlap with the light receiving element in a plan view.

9. The display module of claim 1, wherein the light emitting layer is configured to emit a first light to travel from the light emitting layer to the second light emitting electrode, and wherein the light receiving layer is configured to absorb a second light traveling from the second light receiving electrode to the light receiving layer.

10. The display module of claim 9, wherein the second light has a wavelength equal to or greater than about 495 nm and equal to or smaller than about 570 nm.

11. The display module of claim 9, wherein the light receiving element has an external quantum efficiency of about 50% or more and about 62% or less with respect to the second light.

12. A display module comprising:

first, second, and third light emitting areas;

a non-light-emitting area;

a light receiving area;

a base layer;

a first electrode on the base layer, and comprising:

a first-first light emitting electrode corresponding to the first light emitting area;

a first-second light emitting electrode corresponding to the second light emitting area;

a first-third light emitting electrode corresponding to the third light emitting area; and a first light receiving electrode corresponding to the light receiving area;

an optical compensation layer directly on the first light receiving electrode, and not overlapping with the first-first, first-second, and first-third light emitting electrodes;

a hole transport region comprising:

a first hole transport region on the first-first light emitting electrode, the first-second light emitting electrode, and the first-third light emitting electrode; and a second hole transport region on the optical compensation layer;

a first light emitting layer on the first hole transport region to correspond to the first light emitting area, and configured to emit first-first light to travel from the first-first light emitting electrode to the first hole transport region;

a second light emitting layer on the first hole transport region to correspond to the second light emitting area, and configured to emit first-second light to travel from the first-second light emitting electrode to the first hole transport region;

a third light emitting layer on the first hole transport region to correspond to the third light emitting area, and configured to emit first-third light to travel from the first-third light emitting electrode to the first hole transport region;

a light receiving layer on the second hole transport region, and configured to absorb second light traveling from the second hole transport region to the optical compensation layer;

an electron transport region on the first, second, and third light emitting layers and the light receiving layer; and a second electrode on the electron transport region.

13. The display module of claim 12, wherein the optical compensation layer has a thickness equal to or greater than about 250 angstroms and equal to or smaller than about 330 angstroms.

14. The display module of claim 12, wherein the optical compensation layer has an optical transmittance equal to or greater than about 80%, and an electrical conductivity equal to or smaller than about $10^{-3}$ Ω*cm.

15. The display module of claim 12, wherein the optical compensation layer comprises at least one of indium tin oxide (ITO), indium zinc oxide (IZO), indium gallium zinc oxide (IGZO), tin oxide (TO), zinc oxide (ZO), gallium-doped zinc oxide (GZO), or aluminum-doped zinc oxide (AZO).

16. The display module of claim 12, wherein the light receiving layer has an external quantum efficiency of about 50% or more and about 62% or less with respect to the second light.

17. The display module of claim 12, further comprising:

a capping layer on the second electrode;

an encapsulation layer on the capping layer, and comprising at least one organic layer and at least one inorganic layer;

an input sensing layer on the encapsulation layer, and comprising an input sensing electrode corresponding to the non-light-emitting area; and a color filter layer on the input sensing layer.

18. The display module of claim 17, wherein the color filter layer comprises:

a first-first color filter layer corresponding to the first light emitting area;

a first-second color filter layer corresponding to the second light emitting area;

a first-third color filter layer corresponding to the third light emitting area; and a second color filter layer corresponding to the light receiving area.

19. The display module of claim 18, wherein:

the first-first color filter layer is configured to transmit light having a wavelength equal to or greater than about 620 nm and equal to or smaller than about 750 nm;

the first-second color filter layer is configured to transmit light having a wavelength equal to or greater than about 495 nm and equal to or smaller than about 570 nm;

the first-third color filter layer is configured to transmit light having a wavelength equal to or greater than about 450 nm and equal to or smaller than about 495 nm; and the second color filter layer is configured to transmit light having a wavelength equal to or greater than about 450 nm and equal to or smaller than about 2500 nm.

20. The display module of claim 18, further comprising a light blocking portion corresponding to the non-light-emitting area.

* * * * *